United States Patent
Lin et al.

(10) Patent No.: US 11,935,941 B2
(45) Date of Patent: Mar. 19, 2024

(54) SEMICONDUCTOR STRUCTURE AND METHOD FOR MANUFACTURING THEREOF

(71) Applicant: Taiwan Semiconductor Manufacturing Co., Ltd., Hsinchu (TW)

(72) Inventors: Chih-Hsuan Lin, Hsinchu (TW); Hsi Chung Chen, Tainan (TW); Chih-Teng Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 17/303,794

(22) Filed: Jun. 8, 2021

(65) Prior Publication Data
US 2022/0052175 A1  Feb. 17, 2022

Related U.S. Application Data

(60) Provisional application No. 63/072,503, filed on Aug. 31, 2020, provisional application No. 62/706,405, filed on Aug. 14, 2020.

(51) Int. Cl.
*H01L 29/66* (2006.01)
*H01L 21/8234* (2006.01)
*H01L 29/06* (2006.01)

(52) U.S. Cl.
CPC .. *H01L 29/6656* (2013.01); *H01L 21/823468* (2013.01); *H01L 21/823481* (2013.01); *H01L 29/0649* (2013.01)

(58) Field of Classification Search
CPC ............ H01L 29/6656; H01L 29/0649; H01L 29/41766; H01L 21/823468; H01L 21/76831; H01L 21/823475; H01L 21/823431; H01L 21/823821; H01L 21/823864; H01L 21/823871; H01L 27/088; H01L 27/0886; H01L 27/0924
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |

(Continued)

FOREIGN PATENT DOCUMENTS

| CN | 104867975 A | 8/2015 |
| TW | 201436209 A | 9/2014 |

(Continued)

*Primary Examiner* — Dao H Nguyen
(74) *Attorney, Agent, or Firm* — Haynes and Boone, LLP

(57) ABSTRACT

A semiconductor structure includes a substrate, a conductive region, a first insulation layer, a second insulation layer, a gate structure, a low-k spacer, a gate contact, and a conductive region contact. The low-k spacer is formed between a sidewall of the gate structure and the first insulation layer. The gate contact is landed on a top surface of the gate structure. A proximity distance between a sidewall of the gate contact and the conductive region contact along a top surface of the second insulation layer is in a range of from about 4 nm to about 7 nm. A method for manufacturing a semiconductor structure is also provided.

19 Claims, 14 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,312,354 B2 * | 4/2016 | Liu .................... H01L 29/7833 |
| 9,349,851 B2 * | 5/2016 | Kim .................... H01L 29/4966 |
| 9,520,482 B1 | 12/2016 | Chang et al. |
| 9,576,814 B2 | 2/2017 | Wu et al. |
| 9,653,594 B2 | 5/2017 | Tsai |
| 10,049,929 B2 * | 8/2018 | Hung .................... H01L 23/485 |
| 10,431,661 B2 | 10/2019 | Liu |
| 2014/0103402 A1 * | 4/2014 | Hung ............... H01L 21/76816 |
| | | 438/630 |
| 2014/0264480 A1 * | 9/2014 | Tsao .................... H01L 23/5384 |
| | | 438/303 |
| 2016/0141207 A1 | 5/2016 | Hung et al. |
| 2018/0174904 A1 * | 6/2018 | Hsieh ................ H01L 21/76831 |
| 2019/0165176 A1 * | 5/2019 | Wang ................. H01L 29/7851 |

FOREIGN PATENT DOCUMENTS

| | | |
|---|---|---|
| TW | 201924048 A | 6/2019 |
| TW | 202029351 A | 8/2020 |

\* cited by examiner

SEMICONDUCTOR STRUCTURE AND METHOD FOR MANUFACTURING THEREOF

CROSS REFERENCE TO RELATED APPLICATIONS

This application is related to Applicant's previously filed U.S. Provisional Application Ser. No. 62/706,405, filed Aug. 14, 2020, and U.S. Provisional Application Ser. No. 63/072,503, filed Aug. 31, 2020, which are herein incorporated by reference.

FIELD

The present disclosure relates to a semiconductor structure and method for manufacturing thereof, particularly, the disclosed semiconductor structure includes a low-k spacer laterally in contact with a sidewall of the gate structure for a shifted gate contact landed on the gate structure and the low-k spacer.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform and the critical dimension uniformity of components (or lines) continues to become more difficult to control. For example, the accuracy of photolithography operation may cause overlay shift defect. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
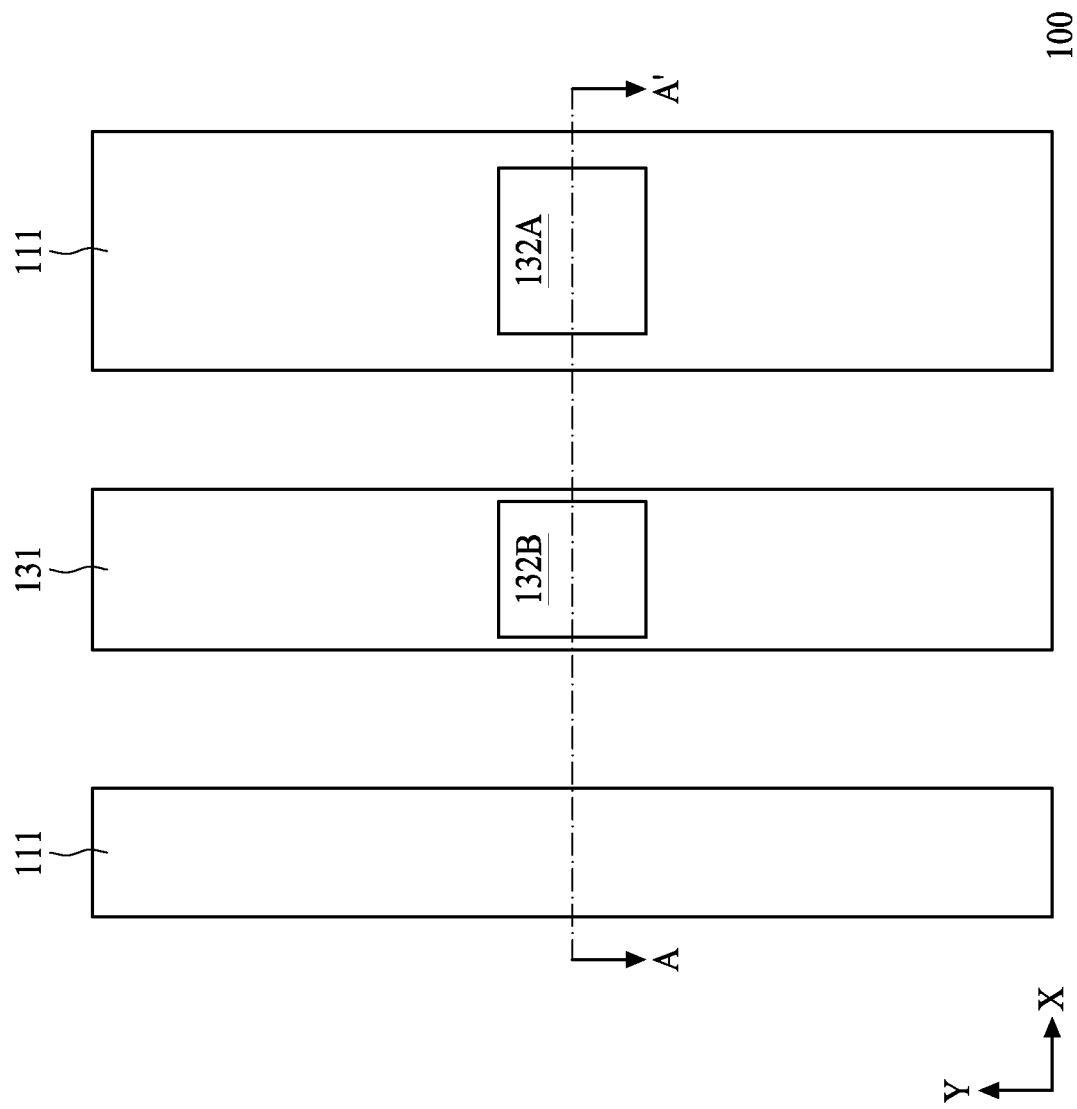
FIG. 1A is a schematic drawing illustrating a top view perspective of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

With the trend of scaling down the geometry size of semiconductor devices, it is difficult to further scaling down the size of gate per se and the vias above source/drain region. Therefore, decreasing the pitch between the gate and source/drain region is one of the methods that may facilitate the scaling down process. However, it is important to decrease the impact on interconnect resistance in order to obtain better device performance, which may be related to mobility. For example, the control of the parasitic capacitance of metal gate to source/drain becomes much more difficult due to the shrinkage of device's geometric.

Meanwhile, in advanced technology nodes (especially under 20 nm), the overlay shift issue occurred in photolithography operation becomes a daunting issue due to smaller pitches between components. Overlay shift may cause defects, dielectric breakdown, electrical short, or increased contact resistance. Therefore, the present disclosure provides a semiconductor structure that may lower the parasitic capacitance and enlarge the acceptance the gate contact's overlay shift budget, which can make semiconductor device's performance has better stability.

Figure 1B:
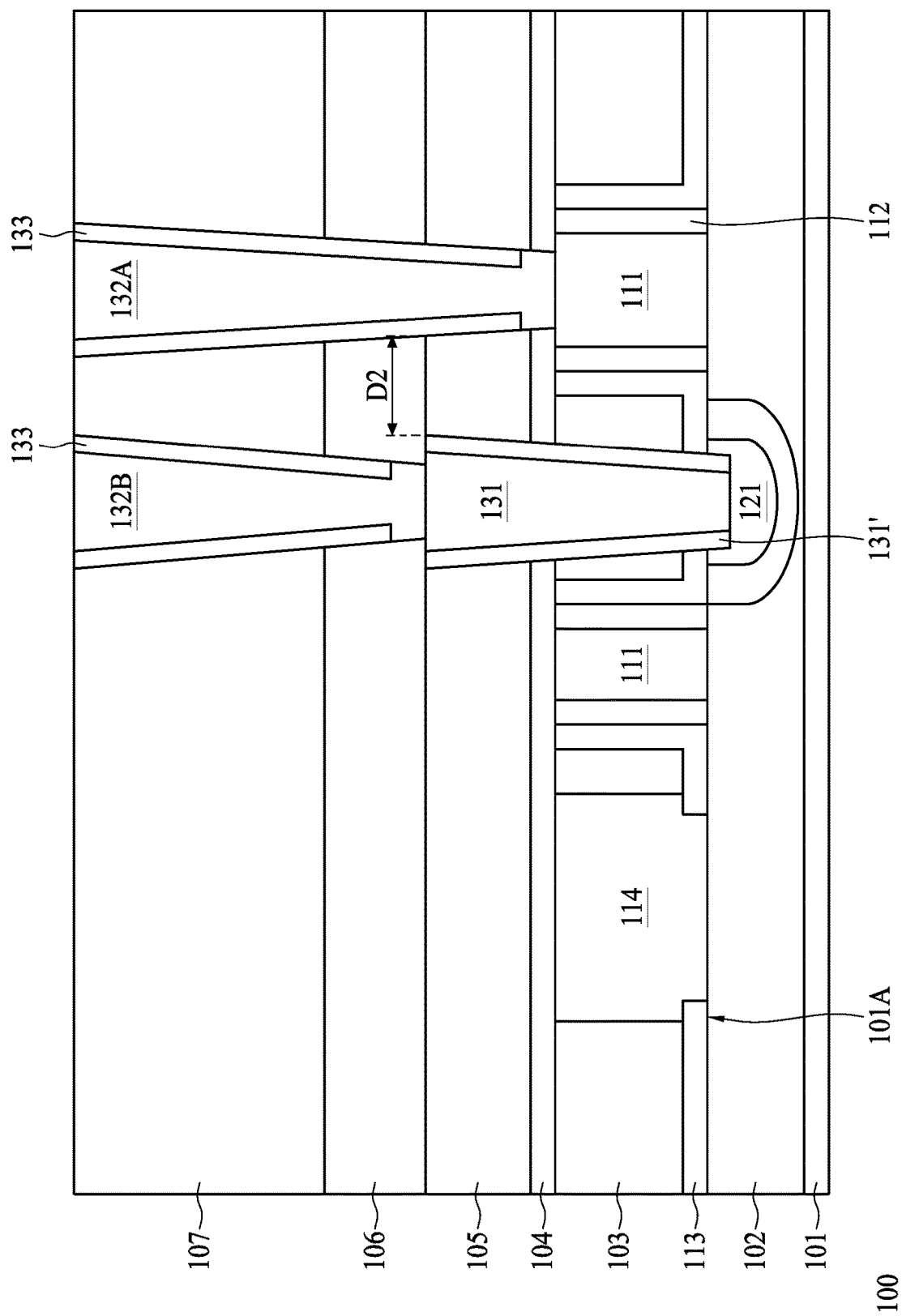
FIG. 1B is a cross sectional view of the semiconductor structure along a line A-A' in FIG. 1A, in accordance with some embodiments of the present disclosure.

Referring to FIG. 1A and FIG. 1B, FIG. 1A is a schematic drawing illustrating a top view perspective of a semiconductor device, FIG. 1B is a cross sectional view of the semiconductor device along a line A-A' (along a primary direction X) in FIG. 1A, wherein various layers such as the etch stop layers and the insulation layers are omitted from FIG. 1A to show the contacts clearly. As shown in FIG. 1B, a semiconductor structure 100 includes a substrate 101. In some embodiments, the substrate 101 includes silicon, alternatively or additionally, the substrate 101 includes another material, such as germanium (Ge), silicon carbide (SiC), gallium arsenide (GaAs), gallium phosphide (GaP), indium phosphide (InP), indium arsenide (InAs), and/or indium antimonide (InSb), or, an alloy semiconductor, such as silicon germanium (SiGe), GaAsP, AlInAs, AlGaAs, GaInAs, GaInP, and/or GaInAsP; or combinations thereof. In some other embodiments, the substrate 101 includes one or more group III-V materials, one or more group II-IV materials, or combinations thereof. In some other embodiments, the substrate 101 is a semiconductor-on-insulator substrate, such as a silicon-on-insulator (SOI) substrate, a silicon germanium-on-insulator (SGOI) substrate, or a germanium-on-insulator (GOI) substrate. The substrate 101 can include various doped regions configured according to design requirements, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, the substrate 101 includes doped regions formed with a combination of p-type dopants and n-type dopants.

In some embodiments, in the cross section illustrated in FIG. 1B, the substrate 101 further includes an isolation region 102 at a first surface 101A of the substrate 101, for example, the isolation region 102 can be shallow trench isolation (STI) alternatingly arranged with semiconductor fin (observable from another cross section dissecting long the semiconductor fin instead of from the cross section dissecting along the STI as shown in FIG. 1B). The first surface 101A may be a top surface of the STI. The isolation region 102 can be utilized to define active regions and electrically isolates various device elements formed over/in the substrate 101. In some embodiments, a first insulation layer 103 may be formed over the isolation region 102. In some embodiments, a thickness of the first insulation layer 103 is in a range of from about 8 nm to about 10 nm.

In some embodiments, the semiconductor structure 100 further includes gate structures 111 and first conductive region contacts 131 laterally surrounded by the first insulation layer 103 and over the isolation region 102. In some embodiments, the gate structure 111 is in contact with the isolation region 102 as well as the semiconductor fins (not shown in FIG. 1B). Each of the gate structures 111 and the first conductive region contacts 131 extends along a secondary direction Y substantially orthogonal to the primary direction X. In some embodiments, the gate structures 111 may be metal gates. In some of the embodiments, a top surface of the gate structure 111 is coplanar with a top surface of the first insulation layer 103.

In some embodiments, a low-k spacer 112 is formed over the sidewalls of each of the gate structures 111, and therefore laterally in contact with the sidewalls of each of the gate structures 111. In some embodiments, a first etch stop layer 113 is formed over a portion over the isolation region 102 that is not occupied by the gate structures 111. The first etch stop layer 113 further spaces between the low-k spacer 112 and the first insulation layer 103. In some embodiments, the low-k spacer 112 is laterally covered by the first etch stop layer 113. In some embodiments, a silicon nitride (SiN) layer 114 may be formed in the first insulation layer 103 and penetrating the first etch stop layer 113 for contacting the isolation region 102 of the substrate 101. In some embodiments, a thickness of the low-k spacer 112 is in a range of from about 2 nm to about 5 nm. In some embodiments, the first insulation layer 103 is made by silicon oxide ($SiO_2$), which may have a dielectric constant/k value in a range of from about 4 to about 6. In some embodiments, a thickness of the first etch stop layer 113 is in a range of from about 4 nm to about 5 nm.

In some embodiments, the low-k spacer 112 is made by a low-k material such as SiOCN. In some embodiments, a concentration of silicon (Si) in the low-k spacer 112 is in a range of from about 25% to about 35%. A concentration of oxygen (O) in the low-k spacer 112 is in a range of from about 4% to about 6%. A concentration of carbon (C) in the low-k spacer 112 is in a range of from about 35% to about 45%. A concentration of nitrogen (N) in the low-k spacer 112 is in a range of from about 15% to about 25%. In some embodiments, the dielectric constant/k value of the low-k spacer 112 is smaller than that of the first etch stop layer 113. In some embodiments, the dielectric constant/k value of the low-k spacer 112 is smaller than that of the first insulation layer 103. In other words, the low-k spacer 112 may have a lowest dielectric constant between the gate structure 111 and the first conductive region contact 131, and may be utilize to reduce the influence between the currents in the gate structure 111 and the first conductive region contacts 131, while the influence between the currents therein may induce resistance-capacitance (RC) delay. Accordingly, by using the low-k spacer 112, the charge mobility in the gate structure 111 and the first conductive region contact 131 may independent from each other. In some embodiments, the dielectric constant of the low-k spacer 112 is in a range of from about 2 to about 3.

In some embodiments, a second etch stop layer 104 may be formed over the first insulation layer 103 and the gate structures 111. The second etch stop layer 104 may include silicon nitride (SiN). In some embodiments, a thickness of the second etch stop layer 104 may be in a range of from about 3 nm to about 5 nm. In some embodiments, a second insulation layer 105 may be disposed over the second etch stop layer 104. In some embodiments, a thickness of the second insulation layer 105 may be thicker than the thickness of the second etch stop layer 104, for example, in a range of from about 8 nm to about 12 nm. In some embodiments, the second insulation layer 105 may include oxide, such as plasma enhanced silicon oxide (PEOX). In some embodiments, a thickness of the second insulation layer 105 may in a range of from about 13 nm to about 16 nm.

In some embodiments, a third etch stop layer 106 may be formed above the second insulation layer 105, wherein the third etch stop layer 106 may include silicon nitride (SiN). In some embodiments, a third insulation layer 107 may be formed above the third etch stop layer 106. The third insulation layer 107 may be interlayer dielectric. In some embodiments, a thickness of the third etch stop layer 106 may be greater than the thickness of the second etch stop layer 104. For example, the thickness of the third etch stop layer 106 may be in a range of from about 8 nm to about 12 nm. In some embodiments, a thickness of the third insulation layer 107 may be greater than the thickness of the second insulation layer 105. For example, the thickness of the third insulation layer 107 may be in a range of from about 30 nm to about 40 nm.

In some embodiments, the substrate 101 may further have a conductive region 121 at the first surface 101A of the substrate 101. As previously discussed, the conductive region 121, for example, an epitaxial region serving as a source or a drain of a transistor, may be formed in the adjacent semiconductor fins (not shown in FIG. 1B) and a coalesced portion of said conductive region 121 is then surrounded by the isolation region 102 separating the adjacent semiconductor fins. In some embodiments, the conductive region 121 is at a position between two gate structures 111. In some embodiments, the conductive region 121 may include epitaxial materials, such as silicon germanium (SiGe), silicon phosphide (SiP), silicon (Si), or other suitable source/drain material. The conductive region 121 may optionally be doped with implants, such as p-type or n-type dopants.

In some embodiments, the first conductive region contact 131 may be formed above and electrically connected to the conductive region 121. In some embodiments, the first conductive region contact 131 may include a conductive material, such as cobalt (Co), or other suitable metal or alloy. In some embodiments, cobalt offers lower resistance, thus can be a material utilized in a device that requires higher operation speed. However, cobalt may be prone to suffer from material loss during subsequent operations (such as annealing, chemical-mechanical planarization, cleaning, etc.) due to the lack of adhesion with low-k material of the first insulation layer 103. Therefore, the present disclosure provides in some embodiments, techniques and configurations to improve the reliability of first conductive region contact 131. For example, the first conductive region contact 131 may further include an outer layer 131' having greater hardness than the inner part. This may be accomplished by using different types of deposition techniques under different formation conditions to tune the properties. In some embodiments, the first conductive region contact 131 may have a tapered structure from a cross sectional view perspective, and therefore a top of the first conductive region contact 131 may have a greater critical dimension than that of a bottom of the first conductive region contact 131 as measured in the X direction.

In some embodiments, the top surface of the first conductive region contact 131 and the top surface of the gate structure 111 are both connected to a via contact, respectively. In some embodiments, the via contact over the gate structure 111 is a gate contact 132A. In some embodiments, the via contact over the first conductive region contact 131 is a second conductive region contact 132B. In some embodiments, a spacer 133 may be disposed at a sidewall (or portion thereof) of the gate contact 132A and a sidewall (or portion thereof) of the second conductive region contact 132B. In some embodiments, the top surface of the gate contact 132A and the top surface of the second conductive region contact 132B are coplanar with a top surface of the third insulation layer 107. In some of the embodiments, a material of the gate contact 132A or the second conductive region contact 132B may be different from the material of the first conductive region contact 131. For example, the first conductive region contact 131 includes cobalt and the gate contact 132A or the second conductive region contact 132B includes tungsten (W). In some embodiments, the gate contact 132A and the second conductive region contact 132B may both have tapered structures form a cross-section view perspective, and therefore a smallest distance between the gate contact 132A and the first conductive region contact 131 is aligned to the top surface of the second insulation layer 105. In some embodiments, a top of the gate contact 132A may have a greater critical dimension than that of a bottom of the gate contact 132A (as measured in the X direction). For example, a top dimension of the gate contact 132A may in a range of from about 18 nm to about 22 nm, while a bottom dimension of the gate contact 132A may in a range of from about 14 nm to about 18 nm. The contacts 131, 132B, 132A may in some implementations include multiple layers.

In some embodiments, the gate contact 132A is fully landed on the top surface of the gate structure 111. However, in some embodiments of the present disclosure, the gate contact 132A may be shifted toward the first conductive region contact 131 by a shift distance D1 (see FIG. 2 and FIG. 3) since the gate contact 132A is laterally surrounded by the low-k spacer 112 or further laterally surrounded by the first etch stop layer 113. In other embodiments, the gate contact 132A may be shifted in a reverse direction by the shift distance D1 and thus further away from the first conductive region contact 131. In some embodiments, without considering the shifting of the gate contact 132A, a proximity distance D2 that is between the sidewall of the gate contact 132A and the top of the first conductive region contact 131 along the top surface of the second insulation layer 105 may be in a range of from about 4 nm to about 7 nm. In some embodiments, under the circumstances that the geometric size of the semiconductor structure has decreased, especially in advanced technology generations, the gate contact 132A may be shifted toward or away from the first conductive region contact 131 within the shift distance D1 in a range of less than about 4 nm.

Figure 2:
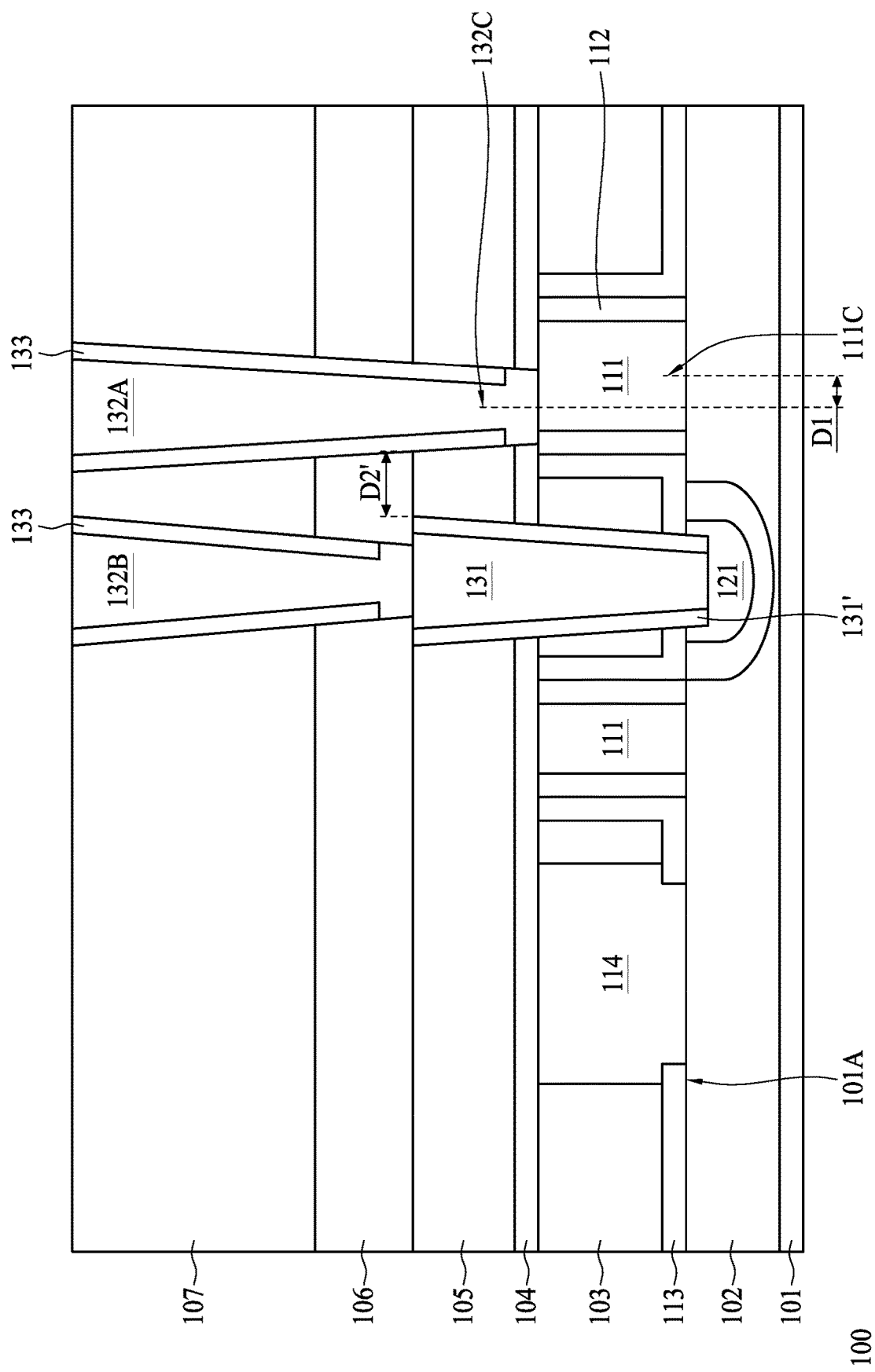
FIG. 2 is a cross sectional view of the semiconductor structure in accordance with some embodiments of the present disclosure.
Figure 3:
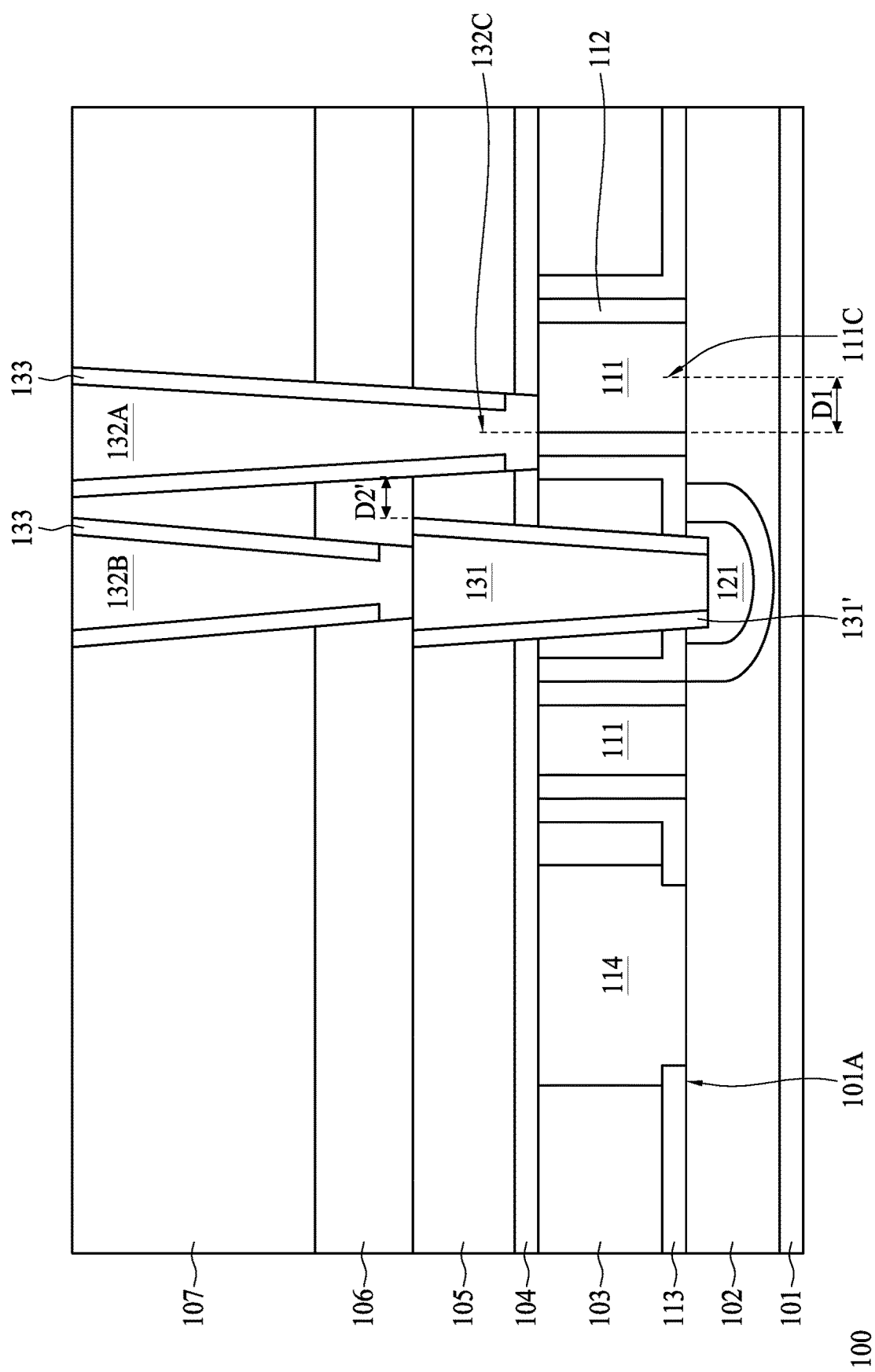
FIG. 3 is a cross sectional view of the semiconductor structure in accordance with some embodiments of the present disclosure.

As shown in FIG. 2 and FIG. 3, in some embodiments, a center 132C of the gate contact 132A is shifted from a center line 111C of the gate structure 111 by the shift distance D1 smaller than the original proximity distance D2 previously shown in FIG. 1B (without shifted gate contact 132A). Such limitation is based on the fact that the gate contact 132A may not in contact with the first conductive region contact 131. In some embodiments, a distance D2' between the sidewall of the gate contact 132A and the top of the conductive region contact 131 is smaller than about 7 nm if the gate contact 132A is shifted toward the first conductive region contact 131.

Once the shift distance D1 is greater than D2 (e.g., about 4 nm), for example, the gate contact 132A may too close to the first conductive region contact 131 and lead to a risk of electrical shorting between the gate contact 132A and the first conductive region contact 131. As previously mentioned, the thickness of the low-k spacer 112 is in a range of from about 2 nm to about 5 nm. In some embodiments, therefore, as shown in FIG. 2, the bottom surface of the gate contact 132A may in contact with the top surface of the low-k spacer 112, while the low-k spacer 112 still may prevent electrical short between the gate contact 132A and the first conductive region contact 131. As shown in FIG. 3, in some embodiments, the bottom surface of the gate contact 132A may further in contact with a top surface of the first etch stop layer 113 since the thickness of the low-k spacer 112 may be less than about 4 nm. In such embodiments, both of the low-k spacer 112 and the first etch stop layer 113 may be utilized to prevent electrical short between the gate contact 132A and the first conductive region contact 131. In other words, the coplanarity of the top surface of the first etch stop layer 113, the top surface of the low-k spacer 112, and the top surface of the gate structure 111 may provide a greater overlay shift budget for the landing of the gate contact 132A, which may provide a better device reliability and yield accordingly.

From another aspect, the present disclosure may have a multi-spacer structure surrounding the gate structure 111, wherein the multi-spacer structure at least includes the low-k spacer 112 and the first etch stop layer 113, or further includes the first insulation layer 103. Under the circumstances that the dielectric constant of the multi-spacer structure is low, particularly, by the usage of the low-k spacer 112, the multi-spacer structure not only may alleviate the issue of parasitic capacitance, electric leakage and/or dielectric breakdown may occur due to closely disposed conductive features (i.e., the proximity of the gate contact 132A and the first conductive region contact 131), but also may broaden the tolerance window of overlay shift for forming the gate contact 132A over the gate structure 111. In some embodiments, due to the thicknesses of the low-k spacer 112 and the first etch stop layer 113, the gate contact 132A may not in contact with the top surface of the first etch stop layer 113; that is, the shift of the gate contact 132A may exceed the limitation of the shift distance D1 before contacting the top surface of the first etch stop layer 113.

Figure 4A:
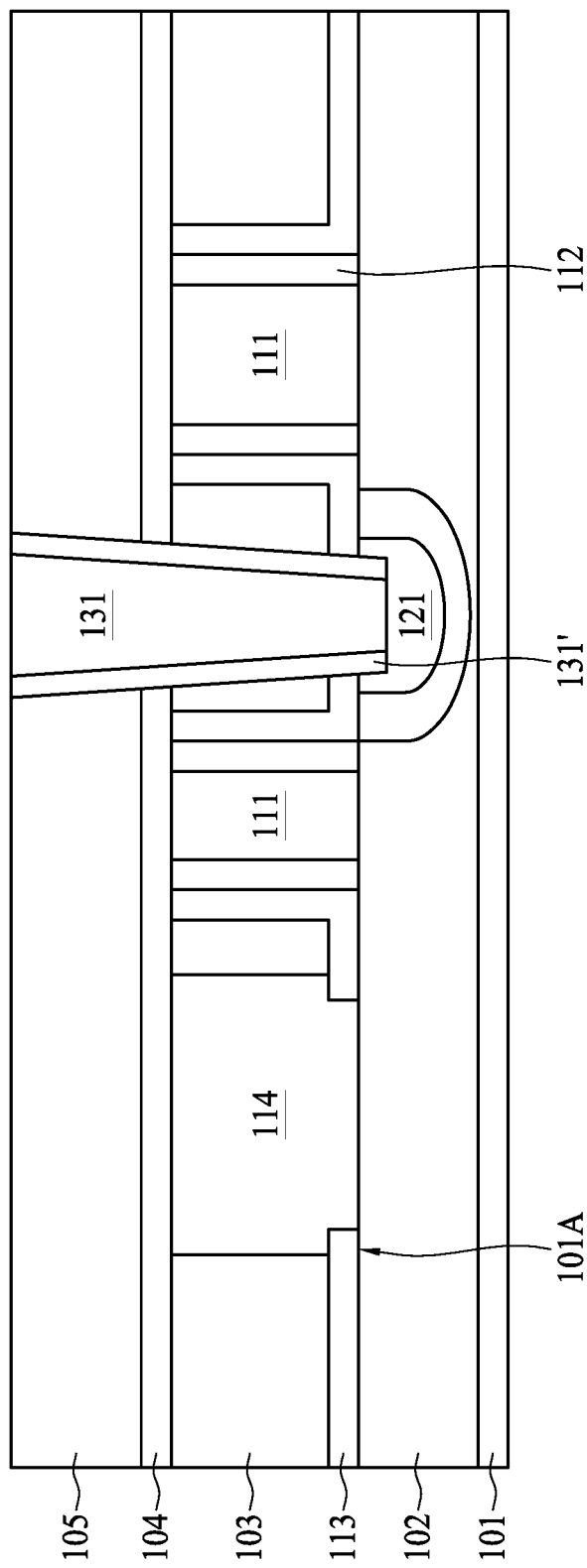
FIG. 4A to FIG. 4J are cross sectional views of a semiconductor device during intermediate stages of manufacturing operations, according to some embodiments of the present disclosure.

FIG. 4A is a cross sectional view of a semiconductor structure during intermediate stages of manufacturing operations, according to some embodiments of the present disclosure. As shown in FIG. 4A, the substrate 101 is provided, wherein the material of the substrate 101 is previously discussed in FIG. 1A to FIG. 3. In such embodiments, the substrate 101 has the isolation region 102 formed at the first surface 101A of the substrate 101. The isolation region 102 may include shallow trench isolation (STI). As previously discussed, the plurality of gate structures 111 are formed over the isolation region 102 as well as the semiconductor fins interposing the isolation regions 102 (not shown in FIG. 4A), and the conductive region 121, for example, an epitaxial region serving as a source or a drain of a transistor, may be formed in the adjacent semiconductor fins (not shown in FIG. 4A) and a coalesced portion of said conductive region 121 is then surrounded by the isolation region 102 separating the adjacent semiconductor fins. In some embodiments, the gate structures 111 may be metal gates. In some embodiments, the gate structures 111 can be formed by replacement gate techniques, where a sacrificial gate (not shown) and the low-k spacers 112 are formed, then the first insulation layer 103 is formed over the first etch stop layer 113, then a planarization operation is performed from the top, and then the sacrificial gate is replaced by conductive material. Alternatively, the formation of the gate structures 111 may be conducted by gate-first approach, gate-last approach, deposition, etching, planarization operation, or other suitable of operation. In some embodiments, the silicon nitride layer 114 may be formed in the first insulation layer 103 and penetrating the first etch stop layer 113.

Subsequently, the second etch stop layer 104 is formed over the first insulation layer 103, and a second insulation layer 105 is formed over the second etch stop layer 104. In some embodiments, the second etch stop layer 104 may include silicon nitride (SiN), and the second insulation layer 105 may include oxide, such as plasma enhanced silicon oxide (PEOX).

In some embodiments, the first conductive region contact 131 is subsequently formed over the conductive region 121. In some embodiments, the first conductive region contact 131 may be formed by forming a recess through the first etch stop layer 113, the first insulation layer 103, the second etch stop layer 104, and the second insulation layer 105 by etching. In some embodiments, the etching operation stops when a bottom of the recess reaches the conductive region 121. In some embodiments, a boron implant can be performed to enhance the electrical property of the conductive region 121. Next, in some embodiments, a conductive material may be formed in the recess. In some embodiments, the conductive material is cobalt, which can be formed by chemical vapor deposition. In some implementations, a silicide layer may be formed between the conductive material of the first conductive region contact 131 and the conductive region 121. Optionally, the formation of the conductive material may include one or more deposition steps, wherein different condition/techniques may result in different physical properties. For example, the conductive material may include a harden conductive material proximal to the sidewall of the recess for forming the outer layer 131'. In addition, a planarization operation, such as chemical mechanical planarization operation may be performed to remove excessive conductive material, thereby forming the first conductive region contact 131. Accordingly, the first conductive region contact 131 is surrounded by the first insulation layer 103, the second etch stop layer 104, and the second insulation layer 105, and a top surface of the first conductive region contact 131 is leveled with the top surface of the second insulation layer 105. In some embodiments, a top critical dimension of the first conductive region contact 131 is in a range of from about 14 nm to about 17 nm, for example, as about 15 nm.

Figure 4B:
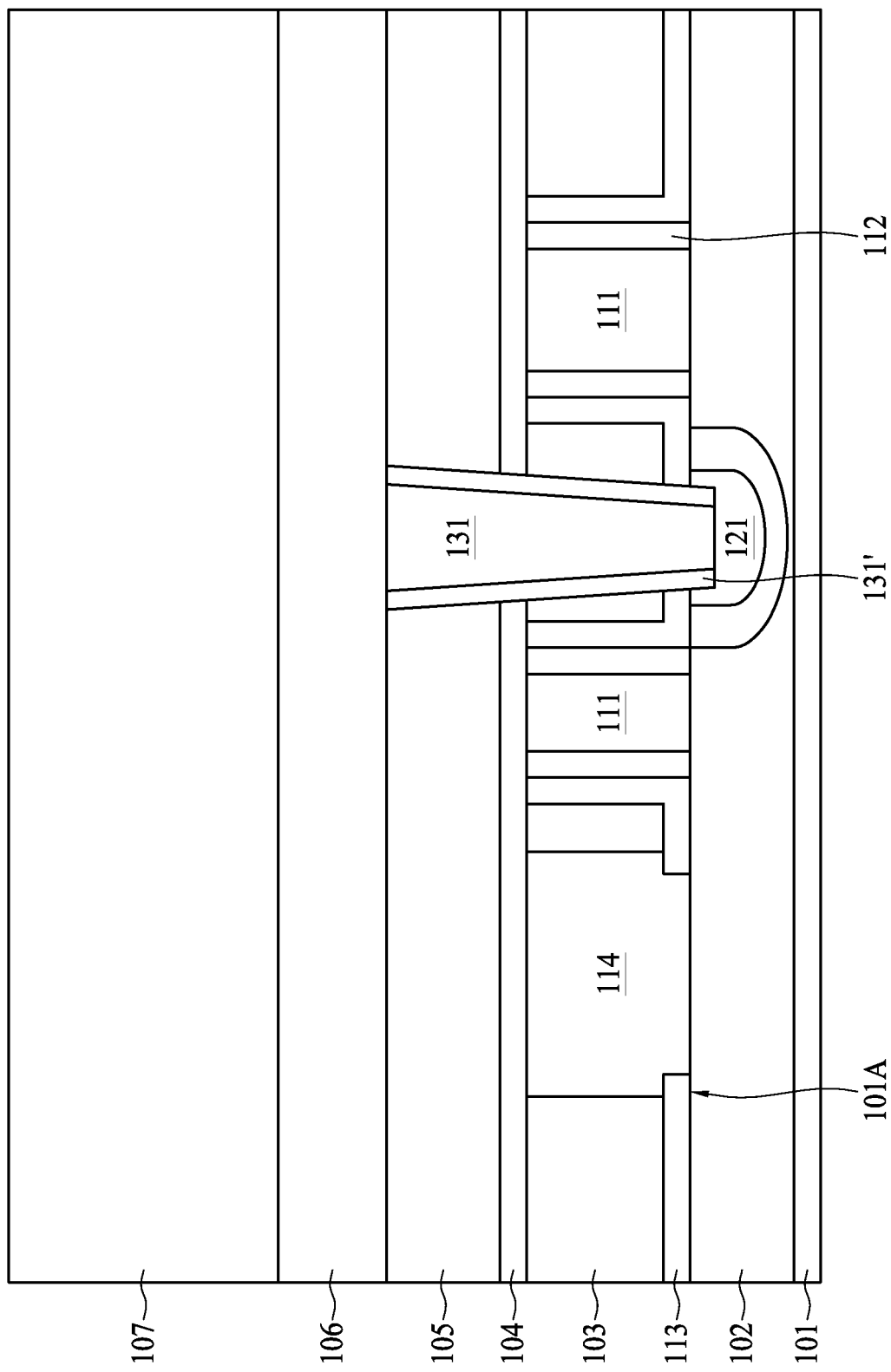

FIG. 4B is a cross sectional view of a semiconductor structure during intermediate stages of manufacturing operations, according to some embodiments of the present disclosure. As shown in FIG. 4B, an insulation stack may be formed over the substrate after the first conductive region contact 131 is formed in the first insulation layer 103 and the second insulation layer 105. In some embodiments, the insulation stack includes the third etch stop layer 106 and the third insulation layer 107. In some embodiments, the third etch stop layer 106 is formed above the second insulation layer 105, wherein the third etch stop layer 106 may include silicon nitride. In some embodiments, the third insulation layer 107 is formed above the third etch stop layer 106.

Figure 4C:
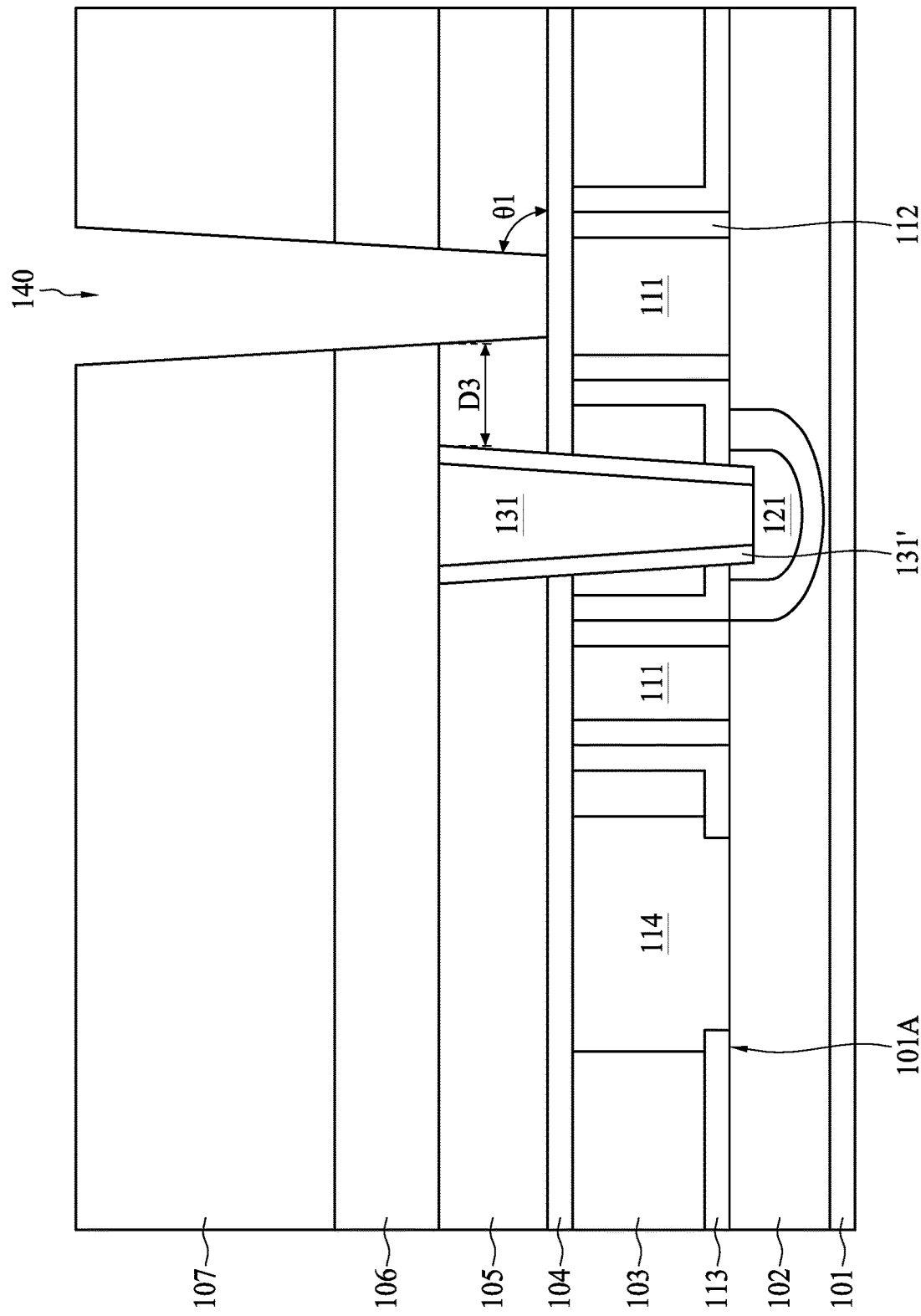
Figure 4D:
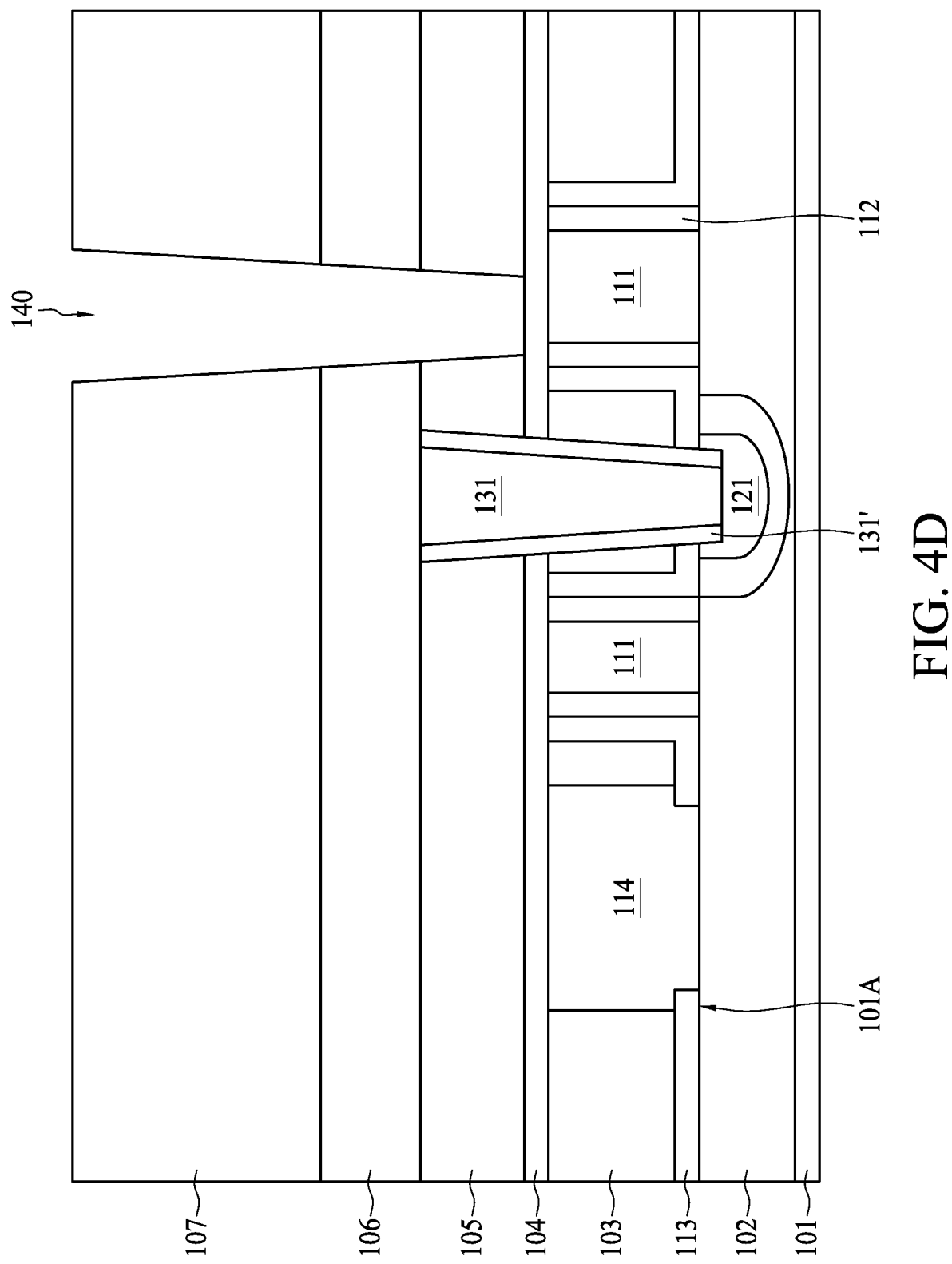
Figure 4E:
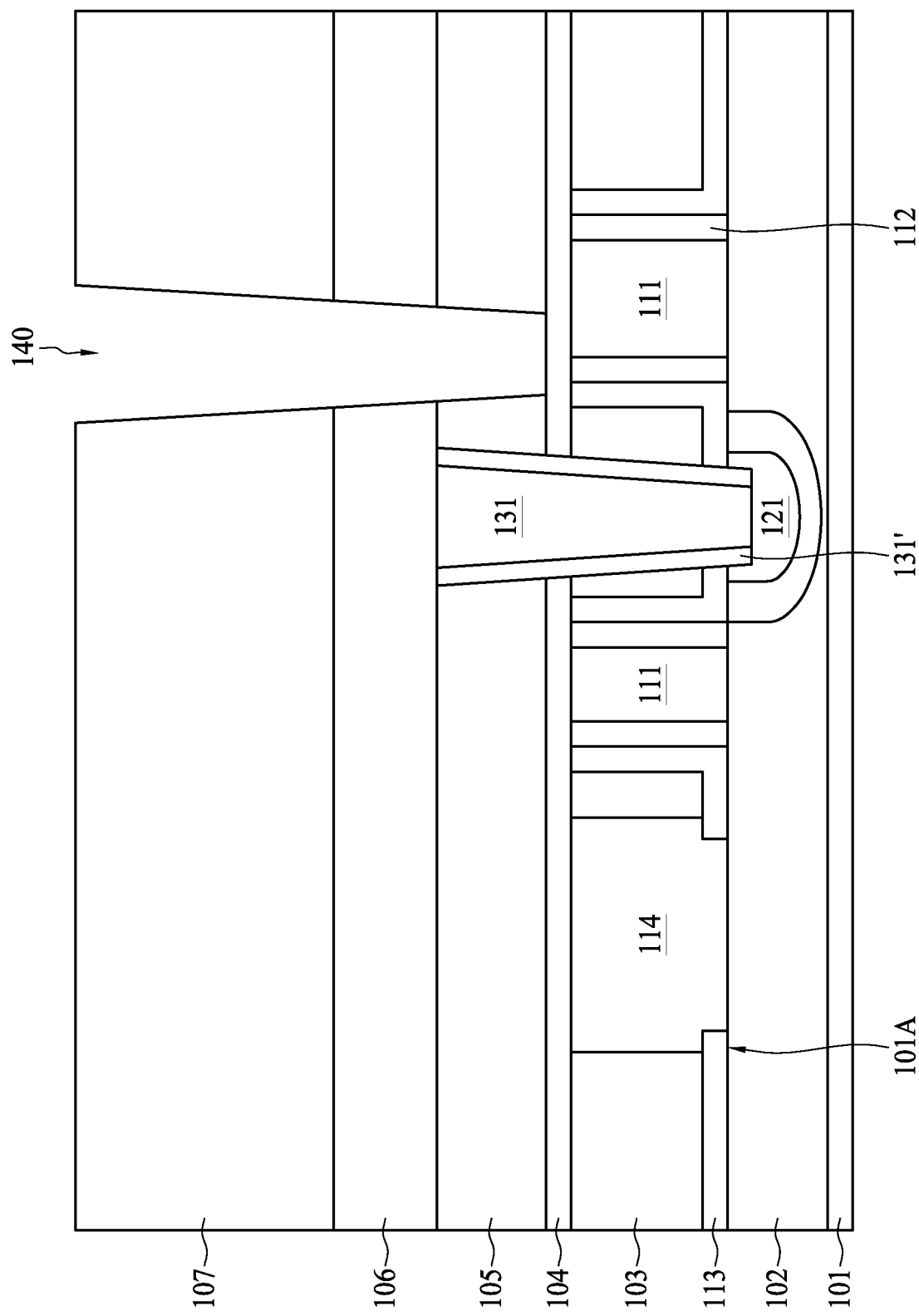

FIGS. 4C, 4D, and 4E are cross sectional views of a semiconductor structure during subsequent intermediate stages of manufacturing operations, according to some embodiments of the present disclosure. As shown in these figures, a first recess 140 traversing the isolation stack (e.g., the third etch stop layer 106 and the third insulation layer 107) and the second insulation layer 105 over the gate structure 111 may be formed. In some embodiments, the first recess 140 is aligned to the top surface of the gate structure 111 and the top surface of the low-k spacer 112. In other words, the first recess 140 not only may align to the top surface of the gate structure 111 for landing thereon, but the top surface of the low-k spacer 112 is also included. In some embodiments, the first recess 140 is aligned to the top surface of the gate structure 111, the top surface of the low-k spacer 112, and the top surface of the first etch stop layer 113. That is, in some embodiments, the process window for forming the first recess 140 may as wide as the critical dimension of the combination of the gate structure 111, the low-k spacer 112, and the first etch stop layer 113 from a top view perspective. Accordingly, as shown in FIG. 4C, a bottom of the first recess 140 may overlap the gate structure 111 only; while in other embodiments, as shown in FIG. 4D, the bottom of the first recess 140 may overlap the gate structure 111 and the low-k spacer 112. As shown in FIG. 4E, in other embodiments, the bottom of the first recess 140 may overlap the gate structure 111, the low-k spacer 112, and the first etch stop layer 113.

In some embodiments, the first recess 140 may be formed by patterning with lithographic techniques (such as extreme ultraviolet, EUV). In some embodiments, the bottom of the first recess 140 is at the second etch stop layer 104, and therefore the gate structure 111 is free from being exposed when forming the first recess 140. In some embodiments, the first recess 140 has a tapered profile form a cross sectional view perspective. In some embodiments, an angle θ1 between a sidewall of the first recess 140 and the top surface of the second etch stop layer 104 is in a range of from about 85 degrees to about 90 degrees, for example, as about 88 degrees. In some embodiments, a distance D3 between the sidewall of the first recess 140 and the first conductive region contact 131 at the top surface of the second insulation layer 105 is in a range of less than about 7 nm, for example, as about 5.5 nm.

Figure 4F:
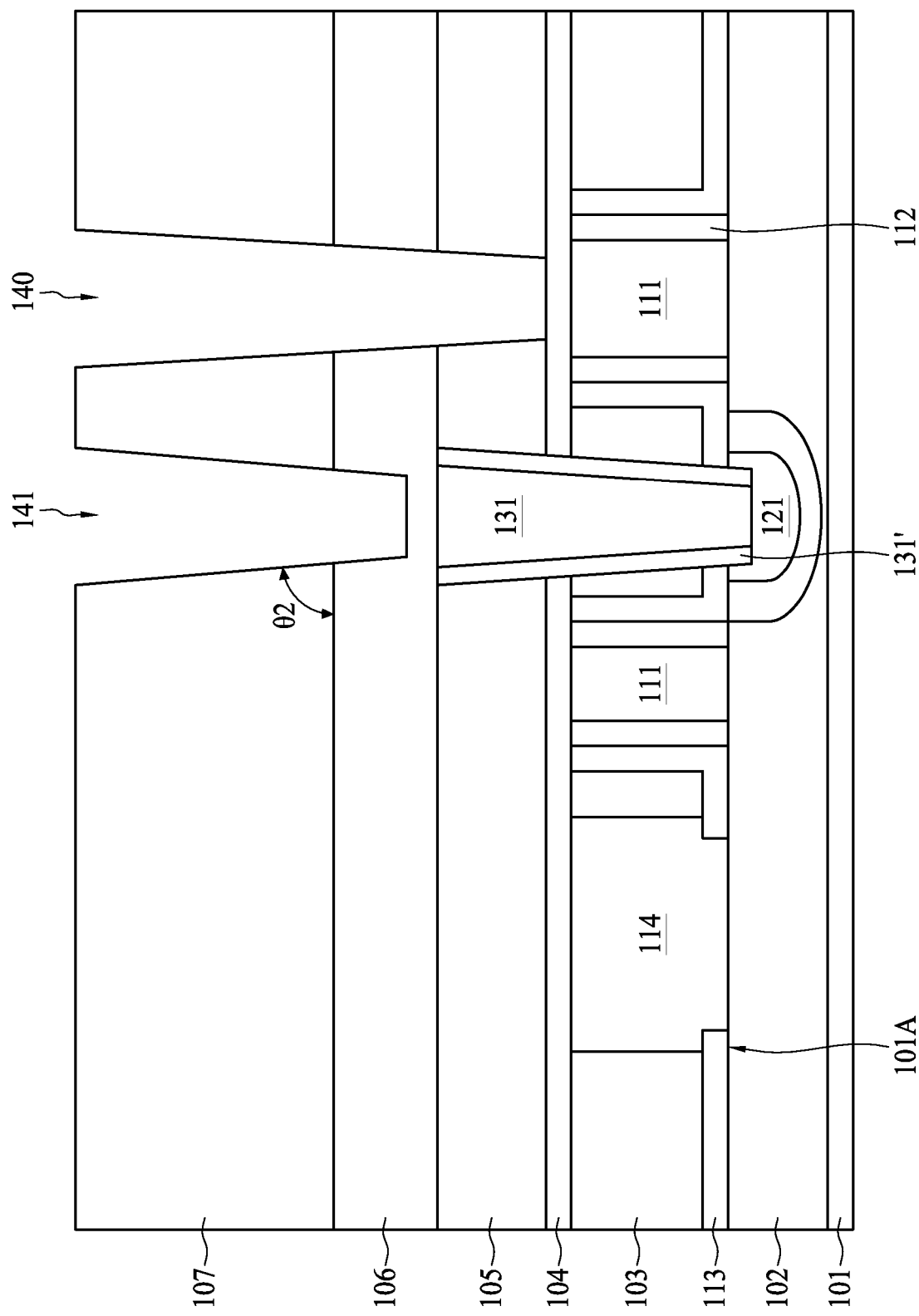

FIG. 4F is a cross sectional view of a semiconductor structure during intermediate stages of manufacturing operations, according to some embodiments of the present disclosure. As shown in FIG. 4F, a second recess 141 traversing the isolation stack (e.g., the third etch stop layer 106 and the third insulation layer 107) over the first conductive region contact 131 may be formed. In some embodiments, the second recess 141 is aligned to the top surface of the first conductive region contact 131. In some embodiments, the second recess 141 may be formed by patterning with lithographic techniques (such as extreme ultraviolet, EUV). In some embodiments, the bottom of the second recess 141 is at the third etch stop layer 106, and therefore the first conductive region contact 131 is free from being exposed when forming the second recess 141. In some embodiments, a thickness of the third etch stop layer 106 left over the first conductive region contact 131 after forming the second recess 141 is about 7.5 nm. In some embodiments, the second recess 141 has a tapered profile form a cross sectional view perspective. In some embodiments, an angle θ2 between a sidewall of the second recess 141 and the top surface of the third etch stop layer 106 is in a range of from about 85 degrees to about 90 degrees, for example, as about 88 degrees.

Figure 4G:
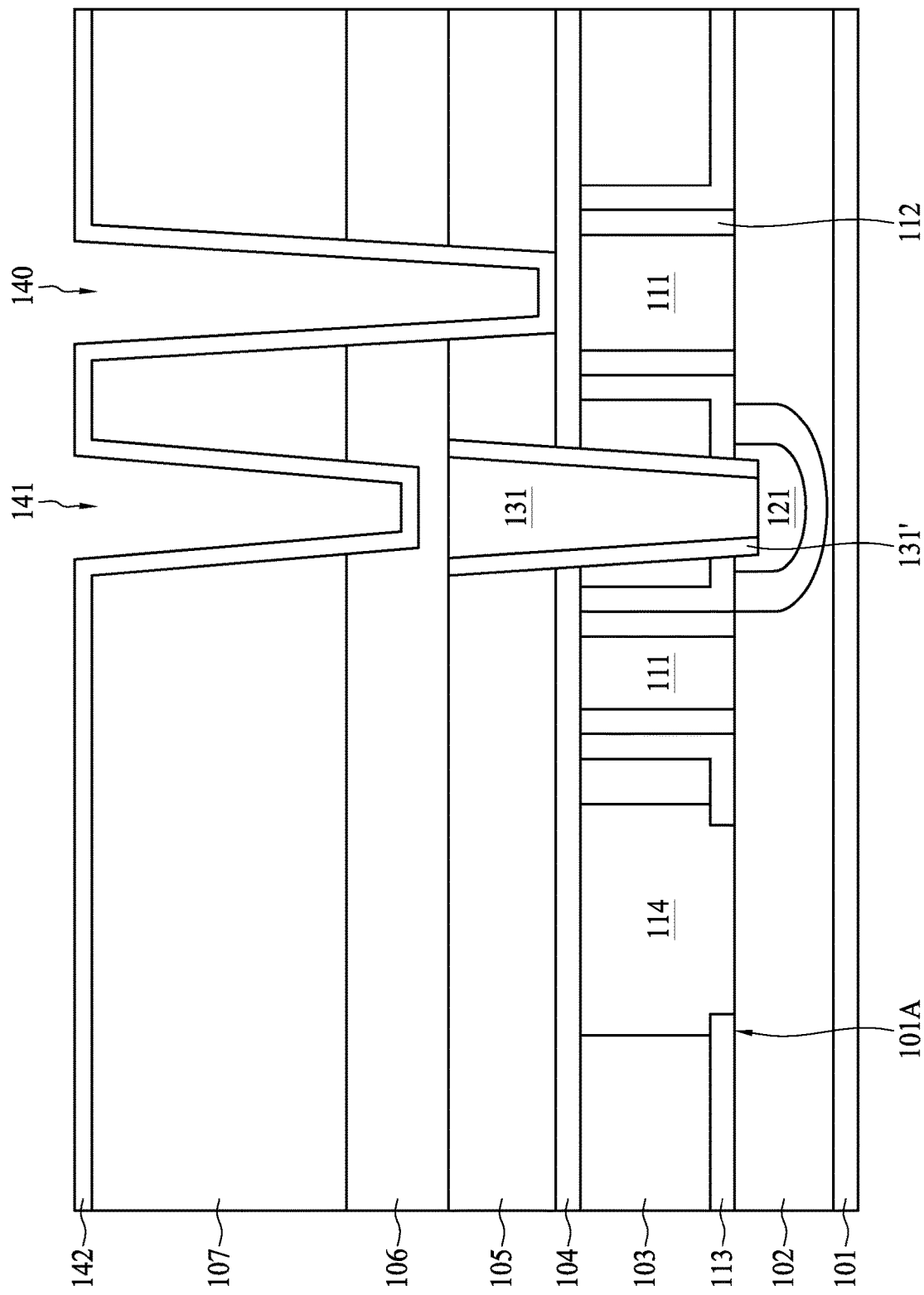

FIG. 4G is a cross sectional view of a semiconductor structure during intermediate stages of manufacturing operations, according to some embodiments of the present disclosure. As shown in FIG. 4G, a recap layer 142 may be formed over the isolation stack (e.g., the third etch stop layer 106 and the third insulation layer 107), the first recess 140 and the second recess 141. In such embodiments, the recap layer 142 is a continuous layer that may cover the top surface of the isolation stack, the sidewall of the first recess 140, the bottom surface of the first recess 140, the sidewall of the second recess 141, and the bottom surface of the second recess 141. In some embodiments, the recap layer 142 is made by silicon nitride (SiN), which may identical to materials of the second etch stop layer 104 and the third etch stop layer 106.

Figure 4H:
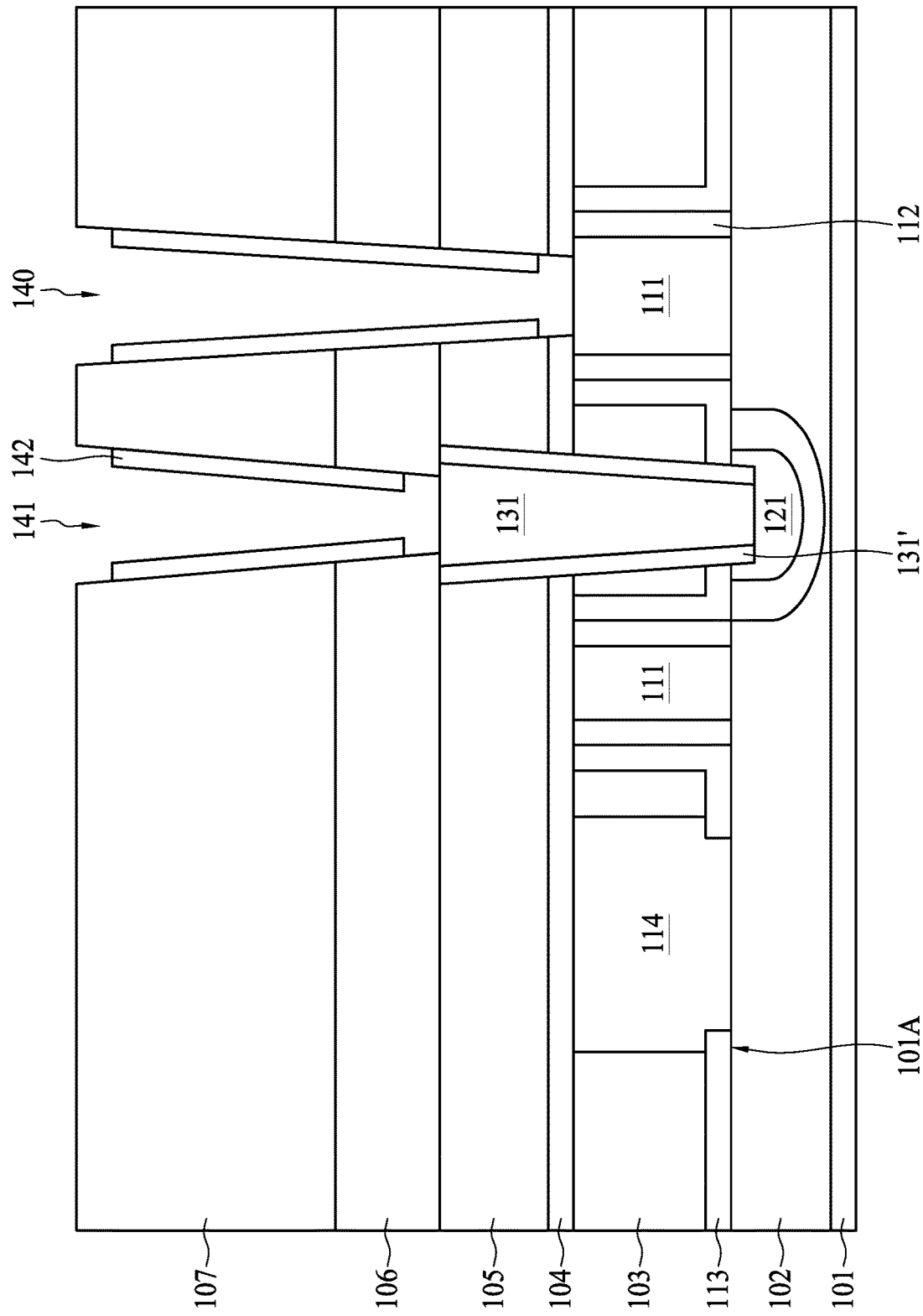

FIG. 4H is a cross sectional view of a semiconductor structure during intermediate stages of manufacturing operations, according to some embodiments of the present disclosure. As shown in FIG. 4H, a top portion and a bottom portion of the recap layer 142 may be removed by an etching operation. In some embodiments, the recap layer 142 is partially removed by an anisotropic etching operation (e.g., dry etching), and therefore only the portion of that recap layer 142 that cover the sidewalls of the first recess 140 and the second recess 141 are remained after the etching operation. The remained recap layer is the spacers 133 previously shown in FIG. 1B to FIG. 3. In such embodiments, the top surface of the gate structure 111 and the top surface of the conductive region contact 131 are also exposed due the removal of portion of the etch stop layers thereon, and thus may be contacted with the via contacts in subsequent operation.

Figure 4I:
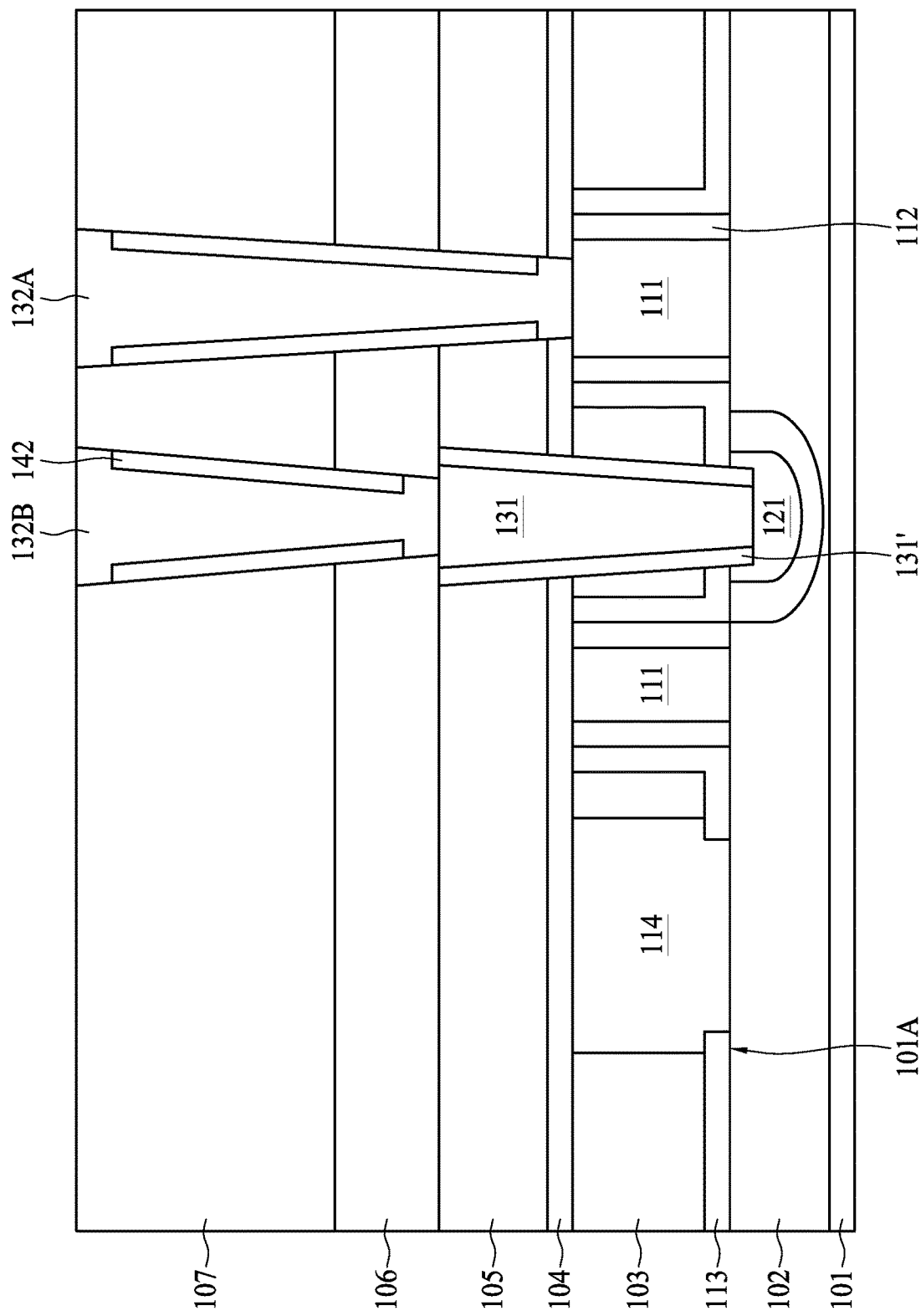
Figure 4J:
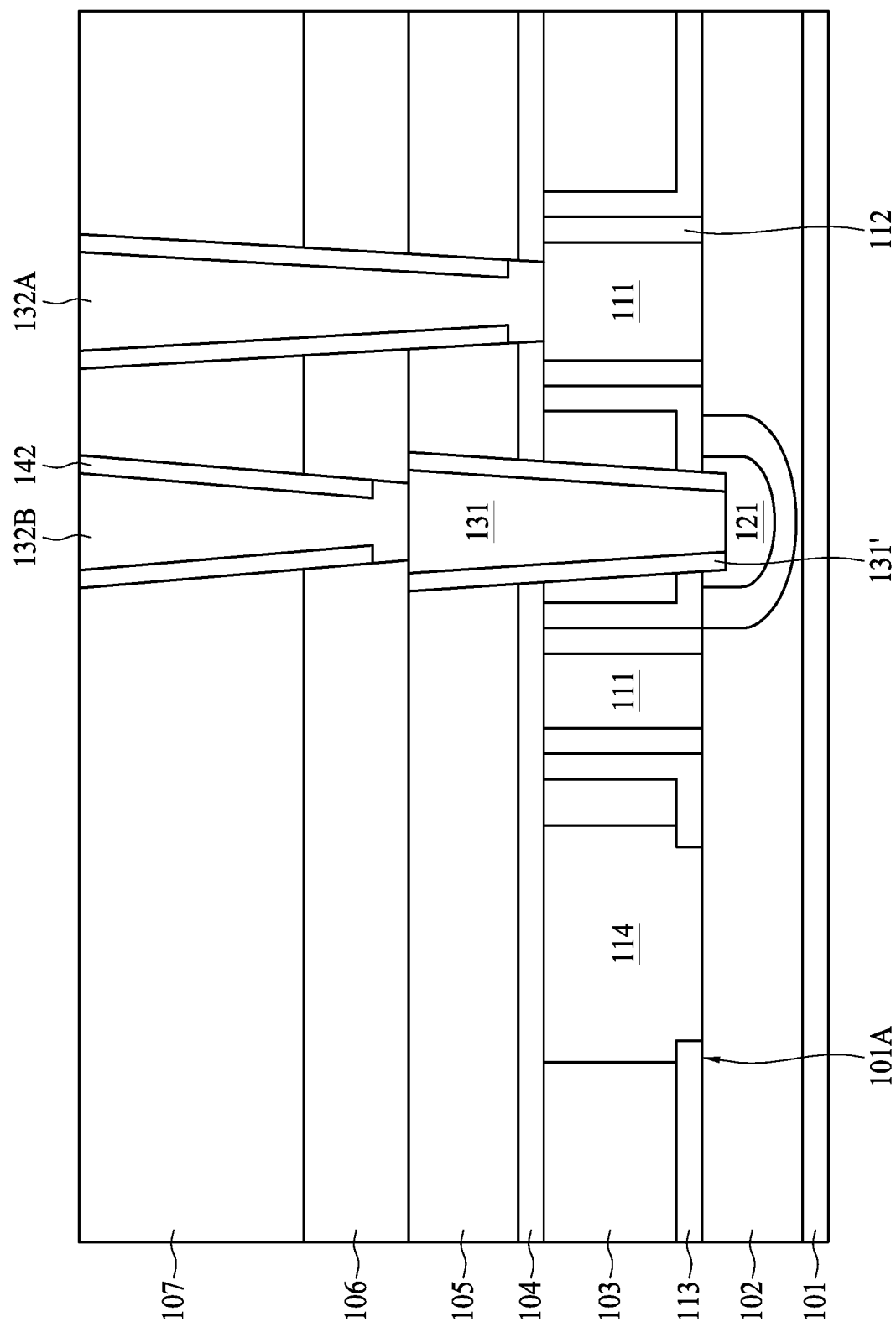

FIGS. 4I and 4J are a cross sectional views of a semiconductor structure during intermediate stages of manufacturing operations, according to some embodiments of the present disclosure. As shown in FIG. 4I, a first via contact (i.e., the gate contact 132A) and a second via contact (i.e., the second conductive region contact 132B) may be formed in the first recess 140 and the second recess 141, respectively. In some embodiments, the gate contact 132A and the second conductive region contact 132B may be formed by depositing a conductive material such as tungsten (W) in the recesses. As shown in FIG. 4J, in some embodiments, a planarization operation (such as chemical-mechanical planarization) may be performed to remove excessive portion of the conductive material, and therefore the thickness of the second insulation layer 107 may be decreased, for example, from more than about 40 nm to in a range of form about 30 nm to about 40 nm.

It is noted that any of the configurations of FIGS. 4C, 4D, 4E may be provided in the following steps illustrated by FIGS. 4F-4J.

According to the present disclosure, a semiconductor structure and method for manufacturing thereof are disclosed. Overall, the present disclosure may provide a greater tolerance for the overlay shift issue of the gate contact, for example, by using the low-k spacer and the first etch stop layer laterally surrounding the gate structure, the tolerance window of overlay shift for forming the gate contact may be broadened or enlarged by the top surfaces of the low-k spacer and the first etch stop layer. Furthermore, the low-k spacer is not only used to create a tolerable shift distance for the landing of the gate contact, but also be used to lower the parasitic capacitance between the gate contact and the conductive region contact. Accordingly, both the RC delay issue and the challenge of the landing of the gate contact under the shrinkage of the semiconductor device's geometric may be alleviate by the present disclosure, and therefore the stability and the reliability of the semiconductor device's performance can be ensured.

In one exemplary aspect, a semiconductor structure is provided. The semiconductor structure includes a substrate, a conductive region, a first insulation layer, a second insulation layer, a gate structure, a low-k spacer, a gate contact, and a conductive region contact. The substrate has a first surface. The conductive region is in the substrate. The first insulation layer is over the first surface. The second insulation layer is over the first insulation layer. The gate structure is over the first surface of the substrate and surrounded by the first insulation layer. The low-k spacer is between a sidewall of the gate structure and the first insulation layer. The gate contact is landed on a top surface of the gate structure. The conductive region contact is over the conductive region and surrounded by the first insulation layer and the second insulation layer. A top surface of the conductive region contact is leveled with a top surface of the second insulation layer. A proximity distance between a sidewall of the gate contact and the conductive region contact along the top surface of the second insulation layer is in a range of from about 4 nm to about 7 nm.

In another exemplary aspect, a semiconductor structure is provided. The semiconductor includes a substrate, a conductive region, a first insulation layer, a second insulation layer, a gate structure, a low-k spacer, a gate contact, and a conductive region contact. The substrate has a first surface. The conductive region is in the substrate. The first insulation layer is over the first surface. The second insulation layer is over the first insulation layer. The gate structure is over the first surface of the substrate and surrounded by the first insulation layer. The low-k spacer is between a sidewall of the gate structure and the first insulation layer. The gate contact is landed on a top surface of the gate structure and a top surface of the low-k spacer. The conductive region contact is over the conductive region and surrounded by the first insulation layer and the second insulation layer.

In yet another exemplary aspect, a method for manufacturing a semiconductor structure is provided. The method includes the following operations. An isolation stack is formed over the substrate. The substrate has a conductive region and an isolation region at a first surface of the substrate, and has a conductive region contact and a gate structure over the conductive region and the isolation region, respectively. The gate structure is laterally surrounded by a low-k spacer. A first recess traversing the isolation stack is formed over the gate structure by aligning the first recess with a top surface of the gate structure and a top surface of the low-k spacer. A second recess traversing the isolation stack is formed over the conductive contact. A recap layer is formed over the isolation stack, the first recess and the second recess. A first via contact and a second via contact are formed in the first recess and the second recess, respectively.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a first surface;
   a conductive region in the substrate;
   a first insulation layer over the first surface;
   a second insulation layer over the first insulation layer;
   a gate structure over the first surface of the substrate and surrounded by the first insulation layer;
   a low-k spacer between a sidewall of the gate structure and an etch stop layer, the etch stop layer between the low-k spacer and the first insulation layer, wherein the low-k spacer has a first dielectric constant, the etch stop layer has a second dielectric constant, and the first insulation layer has a third dielectric constant, wherein the first dielectric constant is smaller than the second dielectric constant and the third dielectric constant, wherein the low-k spacer comprises SiOCN and has a concentration of silicon (Si) in the SiOCN is between about 25% and 35%, wherein a concentration of oxygen (O) in the SiOCN is between about 4% and 6%, wherein a concentration of carbon (C) in the SiOCN is between about 35% and 45%, and wherein a concentration of nitrogen (N) is in the range from about 15% to about 25%;
   a gate contact landed on a top surface of the gate structure; and
   a conductive region contact over the conductive region and surrounded by the first insulation layer and the second insulation layer, a top surface of the conductive region contact being leveled with a top surface of the second insulation layer;
   wherein a proximity distance between a sidewall of the gate contact and the conductive region contact along the top surface of the second insulation layer is in a range of from about 4 nm to about 7 nm.

2. The semiconductor structure of claim 1, wherein the gate contact is landed on the gate structure and the low-k spacer.

3. The semiconductor structure of claim 2, wherein the gate contact shifted from a center of the gate structure by a shift distance smaller than the proximity distance.

4. The semiconductor structure of claim 1, wherein the substrate further has an isolation region at the first surface extending under the conductive region and the gate structure, and the gate structure is in contact with the isolation region.

5. The semiconductor structure of claim 1, wherein a top surface of the etch stop layer, a top surface of the low-k spacer, and the top surface of the gate structure are coplanar.

6. The semiconductor structure of claim 5, wherein a bottom surface of the gate contact is in contact with the top surface of the low-k spacer.

7. The semiconductor structure of claim 6, wherein the bottom surface of the gate contact is further in contact with the top surface of the etch stop layer.

8. A semiconductor structure, comprising:
   a substrate having a first surface;
   a conductive region in the substrate;
   a first insulation layer over the first surface;
   a second insulation layer over the first insulation layer;
   a gate structure over the first surface of the substrate and surrounded by the first insulation layer;
   a low-k spacer between a sidewall of the gate structure and the first insulation layer, wherein a dielectric constant of the low-k spacer is between about 2 and about 3;
   a gate contact extending through the second insulation layer and landing on a top surface of the gate structure and a top surface of the low-k spacer, wherein the gate contact includes a sidewall extending from a first end region to a second end region and a recap layer disposed on a middle region of the sidewall between the first end region and the second end region wherein the first and second end regions are free of the recap layer; and
   a conductive region contact over the conductive region and surrounded by the first insulation layer and the second insulation layer.

9. The semiconductor structure of claim 8, wherein the low-k spacer comprises SiOCN.

10. The semiconductor structure of claim 8, wherein a distance between a sidewall of the gate contact and a top surface of the conductive region contact is smaller than about 7 nm.

11. The semiconductor structure of claim 8, wherein a bottom dimension of the gate contact is in a range of from about 14 nm to about 18 nm.

12. The semiconductor structure of claim 8, wherein a top surface of the first insulation layer is coplanar with the top surface of the gate structure.

13. The semiconductor structure of claim 8, wherein a top surface of the second insulation layer is coplanar with a top surface of the conductive region contact.

14. The semiconductor structure of claim 13, wherein a smallest distance between the gate contact and the conductive region contact is aligned to the top surface of the second insulation layer.

15. The semiconductor structure of claim 8, wherein a center of the gate contact is shifting away from a center of the gate structure in a shift distance less than about 4 nm.

16. A semiconductor structure, comprising:
   an epitaxial region over a substrate;
   a first insulation layer over the epitaxial region and the substrate;
   a gate structure over the substrate, wherein the gate structure includes a centerline defined in a first cross-sectional view;
   a spacer element disposed on sidewalls of the gate structure, wherein the spacer element is SiOCN;
   a first contact extending through the first insulation layer to interface a top surface of the gate structure and a top surface of the spacer element, wherein the first contact has a centerline defined in the first cross-sectional view that is displaced a first shift distance from the centerline of the gate structure, and wherein the first contact includes a sidewall extending from a first terminal end to a second terminal end and a recap layer disposed on a middle region of the sidewall, wherein a first end region adjacent the first terminal end and a second end region adjacent the second terminal end are free of the recap layer; and
   a second contact over and extending towards the epitaxial region.

17. The semiconductor structure of claim 16, wherein the centerline is substantially perpendicular to a top surface of the substrate.

18. The semiconductor structure of claim 16, wherein a concentration of silicon (Si) in the SiOCN is between about 25% and 35%, wherein a concentration of oxygen (O) in the SiOCN is between about 4% and 6%, wherein a concentration of carbon (C) in the SiOCN is between about 35% and 45%, and wherein a concentration of nitrogen (N) is in the range from about 15% to about 25%.

19. The semiconductor structure of claim 16, wherein the recap layer includes SiN.

* * * * *